United States Patent
Garro et al.

(10) Patent No.: US 9,691,482 B1
(45) Date of Patent: Jun. 27, 2017

(54) OPTICAL STORAGE DEVICE UTILIZING QUANTUM SILOS

(71) Applicant: International Business Machines Corporation, Armonk, NY (US)

(72) Inventors: Pablo Barquero Garro, San Jose (CR); Ricardo Golcher Ugalde, San Jose (CR); Franz Friedrich Liebinger Portela, Heredia (CR); Meller Javier Perez Nunez, San Jose (CR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/339,902

(22) Filed: Oct. 31, 2016

(51) Int. Cl.
  *G11C 11/34* (2006.01)
  *G11C 13/04* (2006.01)
  *G06N 99/00* (2010.01)

(52) U.S. Cl.
  CPC .......... *G11C 13/047* (2013.01); *G11C 13/048* (2013.01); *G06N 99/002* (2013.01)

(58) Field of Classification Search
  CPC ............ G11C 13/0004; G11C 13/0069; G11C 13/004; G11C 2213/71; G11C 11/56; G11C 11/5678; G11C 13/003; G11C 2013/0092; G11C 2213/76; G11C 5/02; G11C 2013/0078; G11C 8/10; G11C 13/0023; G11C 2213/15; G11C 2213/72
  USPC .......... 365/163, 148, 129, 145, 158, 230.06, 365/189.011, 151, 113, 171, 173, 200, 63, 365/100, 157, 162, 168
  See application file for complete search history.

(56) References Cited

U.S. PATENT DOCUMENTS

| | | | |
|---|---|---|---|
| 8,351,250 B2 * | 1/2013 | Lowrey | G11C 13/0004 365/148 |
| 2009/0052297 A1 | 2/2009 | Ku et al. | |
| 2012/0063253 A1 | 3/2012 | Bae et al. | |
| 2013/0107617 A1 | 5/2013 | Skold et al. | |
| 2013/0135980 A1 | 5/2013 | Liu | |

* cited by examiner

*Primary Examiner* — Thong Q Le
(74) *Attorney, Agent, or Firm* — Steven M. Greenberg, Esq.; CRGO Law

(57) ABSTRACT

An optical storage device utilizing quantum silos includes a multiplicity of quantum silos in a substrate. Each silo includes one or more quantum dots and a multiplicity of crystals of an orthogonal shape surrounding a quantum dot. The crystals are positioned in an array at each corner, a set of mirrors are positioned at remaining cells of a perimeter of the array and an orthogonally shaped crystal surrounding a quantum dot is positioned at an interior cell. A set of receivers surrounds each silo and points inwardly towards the perimeter. A storage layer is formed by a matrix of the silos with alternate matrix cells marking a position of a corresponding silo and remaining cells transporting data from the silos. A reading and a writing layer are sandwiched beneath the storage layer and multiple sandwiched layers are stacked to form a storage unit with an igniter layer disposed therebetween.

16 Claims, 3 Drawing Sheets

OPTICAL STORAGE DEVICE UTILIZING QUANTUM SILOS

BACKGROUND OF THE INVENTION

Field of the Invention

The present invention relates to optical storage and more particularly to quantum dot constructed memory storage.

Description of the Related Art

Optical storage refers to an electronic storage medium which utilizes low-power laser energy to record and retrieve digital information from an underlying medium. In optical-storage technology, a laser beam encodes digital data onto an optical disc in the form of small pits arranged in concentric tracks on the surface of the disk. A low-power laser scanner reads the pits, with variations in the intensity of reflected light from the pits being converted into electric signals. Optical discs may permanently store information and, in that instance, are read-only. Optical discs may also be fully re-writable. Thus, optical discs may be viewed as an alternative form of fixed storage—an equivalent to a hard disk drive.

Optical storage is not limited to fixed storage, though. Modern advancements in quantum dot technology now enable the construction and use of high speed optical memories. A quantum dot is a small composition of matter, a crystal with a diameter on the order of nanometers, that is concentrated into a single point and thus is zero-dimensional. As a result, the particles inside the quantum dot that carry electricity—namely electrons and holes—become constrained within the quantum dot and demonstrate well-defined energy levels according to quantum theory. Generally, quantum dots are formed on a semiconductor substrate, and although quantum dots physically are crystals, quantum dots behave more like individual atoms and thus are often nicknamed "artificial atoms".

Quantum dots are precise crystals, and thus are fabricated in the same way as any other precise semiconductors crystal. Typical methods include molecular beam epitaxy, ion implantation and X-ray lithography. In molecular beam epitaxy, beams of atoms are fired at a "base" or substrate so that a single crystal slowly builds. In ion implantation, ions are accelerated electrically and fired at a substrate. In X-ray lithography, an atomic-scale engraving process engraves the relevant crystalline features in the substrate utilizing X rays.

Optical computers use quantum dots in much the same way that electronic computers use transistors as the basic components in memory. In quantum memory, bits are stored not by transistors but by individual atoms, ions, electrons, or photons entangled and acting as quantum bits. More specifically, an optical memory controller writes data to an array of quantum dots by creating light and dark portions of the crystalline structure in which the quantum dots are formed. During a refresh phase, the controller maintains dark areas in the structure while re-illuminating light areas of the structure as laser light exists through the structure. Finally, during a read phase, the controller reads out from the crystalline structure dark and light areas and interprets the light and dark areas as binary digits. As will be recognized then, the atomic scale size of quantum dots permits the formation of highly dense high speed optical storage in which substantial volumes of data may be stored.

BRIEF SUMMARY OF THE INVENTION

Embodiments of the present invention address deficiencies of the art in respect to optical storage and provide a novel and non-obvious method, system and computer program product for optical storage utilizing quantum silos. In an embodiment of the invention, an optical storage device fabrication method is provided. The method includes forming different quantum silos in a substrate. Each of the quantum silos includes one or more quantum dots, each including a storage unit of a predefined storage capacity. Each of the quantum silos also includes a multiplicity of crystals each with an orthogonal shape with eight faces in three bands surrounding a corresponding one of the quantum dots. Each of the crystals is positioned in an array with one of the crystals at each corner of the array. The remaining cells of the array at a perimeter of the array each include set of mirrors. Finally, at least one interior cell of the array includes an orthogonally shaped crystal of four faces in three bands surrounding a corresponding one of the quantum dots.

A set of receivers is placed in the substrate surrounding each of the quantum silos and pointing inwardly towards a perimeter of the array. As well, a matrix of the quantum silos is created to form a storage layer, in that alternate cells in the matrix each mark a position of a corresponding one of the quantum silos and remaining ones of the cells transport data from the quantum silos. Finally, a reading layer and a writing layer are sandwiched beneath the storage layer and the multiple sandwiched storage, reading and writing layers are stacked to form an optical storage unit with an igniter layer disposed between each sandwiched reading, writing and storage layer enabling an ultraviolet light source to illuminate the quantum dots of the quantum silos.

In one aspect of the embodiment, each array of a corresponding one of the quantum silos is a three by three (3×3) array with five vertices forming an X shape of quantum silos. In another aspect of the embodiment, the set of mirrors includes three mirrors each shaped as a one by three (1×3) orthogonal array, a middle one of the mirrors having three faces each corresponding to one of three faces of an adjacent side of an adjacent interior one of the crystals, and each outer one of the mirrors having a three faces each corresponding to one of three faces of an adjacent side of an adjacent corner one of the crystals. In yet another aspect of the embodiment, each of the receivers has nine readers disposed in a 3×3 orthogonal array to provide for a corresponding one of the quantum silos one-hundred and eight (108) bits storage capacity.

Notably, the storage layer may be referenced as a memory page mapped in a memory addressing model. To that end, the method includes writing to a selected one of the quantum silos at selected ones of the corners of an array of the selected one of the silos by firing a light beam against a corner of the array of the selected one of the silos towards a surrounded one of the quantum dots for bytes corresponding to a two, nearest ones of the readers, and setting a refresh interval and at each refresh interval, firing the light beam so as to refresh data stored in the selected one of the quantum silos. Likewise, the method includes writing to a selected one of the quantum silos at an interior portion of the array of the selected one of the silos by firing a light beam against faces of one of the mirrors in a set adjacent to the selected one of the quantum silos at the interior portion of the array, and setting a refresh interval and at each refresh interval, firing the light beam so as to refresh data stored in the selected one of the quantum silos. Finally, the method includes reading a byte from a selected one o the quantum silos by verifying ones of the receivers at a perimeter of a corresponding array of the selected one of the quantum silos for a presence or absence of light emitting from a surrounded one of the quantum dots.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Embodiments of the invention provide for an optical storage device utilizing quantum silos. A quantum silo is formed in a substrate and includes a quantum dot that defines a storage unit of predefined storage capacity. Multiple different crystals surround the quantum dot and have an orthogonal shape with eight faces in three bands. Each of the crystals are positioned in an array with one crystal at each corner of the array. The remaining cells of the array at a perimeter of the array include a set of mirrors, while an interior cell of the array has an orthogonally shaped crystal of four faces in three bands surrounding a corresponding quantum dot. Within the array, set of receivers are disposed in the substrate surrounding each of the quantum silos and point inwardly towards a perimeter of the array.

A matrix of the quantum silos is then created to form a storage layer in so far as alternate cells in the matrix each mark a position of a corresponding one of the quantum silos while remaining ones of the cells transport data from the quantum silos. The storage layer is sandwiched with both a reading layer and also a writing layer in order to form an optical storage unit. Finally, the optical storage unit is stacked upon other optical storage units with an igniter layer disposed therebetween so as to enable an ultraviolet light source to illuminate the quantum dots of the quantum silos. In this way, high speed optical storage is achieved.

Figure 1A:
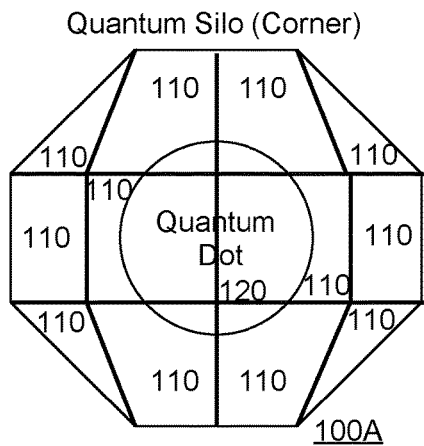
FIGS. 1A through 1D pictorially illustrate different views of a quantum silo.
Figure 1B:
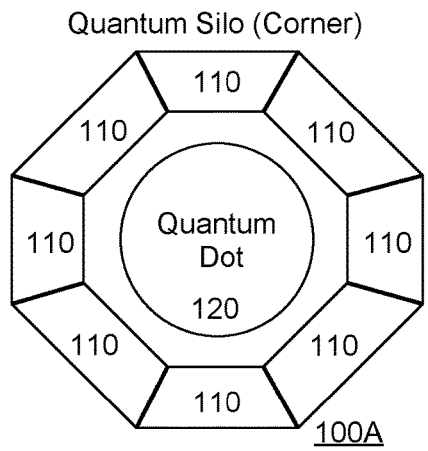
Figure 1C:
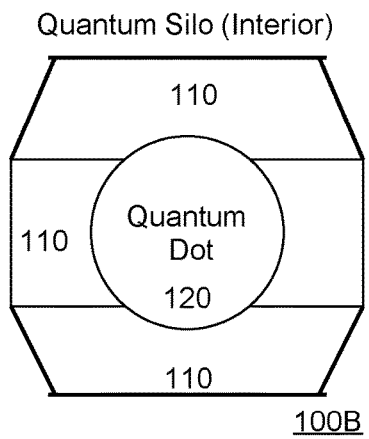
Figure 1D:
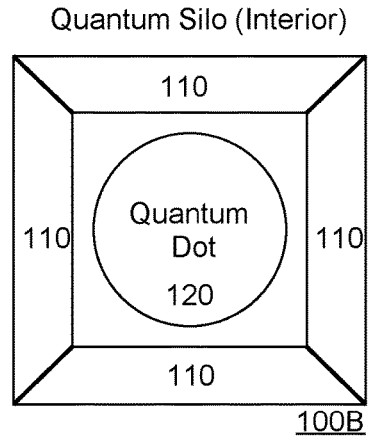
Figure 1E:
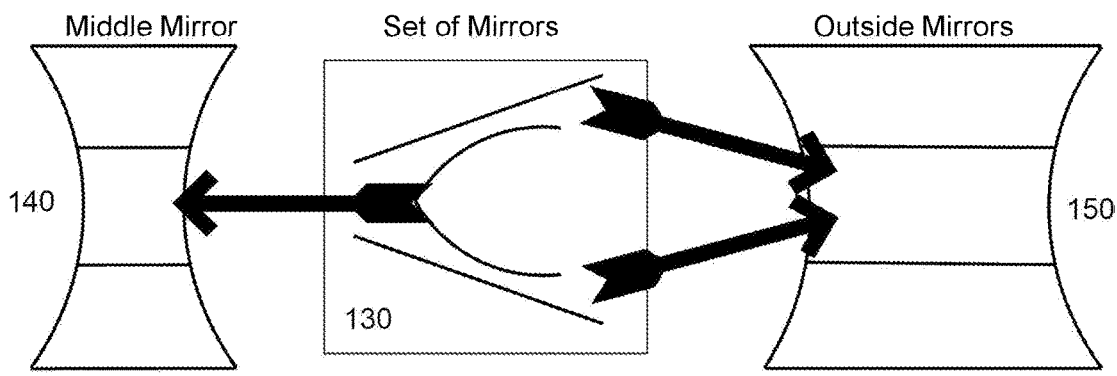
FIG. 1E is a pictorial illustration of a set of mirrors adapted for disposition within an array of quantum silos.

In further illustration, FIGS. 1A through 1D pictorially show different views of a quantum silo. As shown in FIGS. 1A and 1B, quantum silo 100A adapted for disposition at a corner of an array of quantum silos is formed by a crystal of orthogonal shape with eight faces 110 in three bands enveloping a quantum dot 120. Likewise, as shown in FIGS. 1C and 1D, a quantum silo 100B adapted for disposition at an interior cell of an array of quantum silos is formed by a crystal of orthogonal shape with four faces 110 in three bands surrounding a corresponding quantum dot 120. Finally, as shown in FIG. 1E, a set of mirrors 130 includes three mirrors each shaped as a 1×3 orthogonal array. The middle mirror 140 has three faces each corresponding to one of three faces of an adjacent side of an adjacent interior one of the crystals. The outer mirrors 150 each has a three faces, each corresponding to one of three faces of an adjacent side of an adjacent corner one of the crystals.

Figures 2, 3:
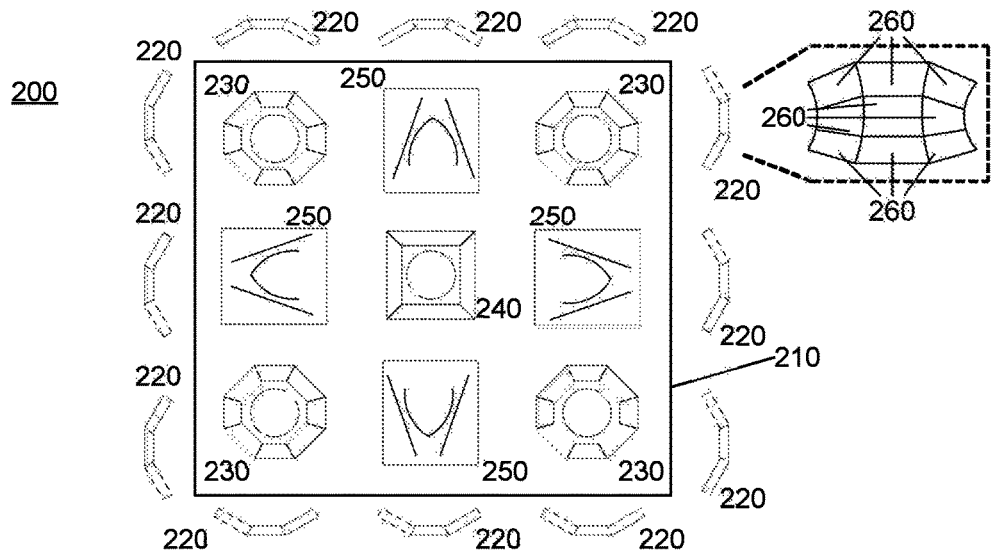
FIG. 2 is a schematic illustration of an array of quantum silos configured with a multiplicity of receivers and adapted for disposition within a grid of a storage layer.
FIG. 3 is a schematic illustration of a grid of storage layer adapted for disposition within an optical storage unit.

Referring now to FIG. 2, the quantum silos of FIGS. 1A through 1D are disposed within an array of the quantum silos 200. Specifically, a corner quantum silo 230 is placed in a 3×3 array 210 at each corner vertex and an interior quantum silo 240 is placed at a center vertex of the 3×3 array 210 so as to form an X shape. It is of note, that while the shape formed by the quantum silos 230, 240 is an X shape, other shapes may be defined so long as the configuration of the crystals of the quantum silos 230,240 is reset to adapt to the respective positions of the corresponding quantum dots.

The remaining cells of the 3×3 array 210 are then populated with a corresponding set of mirrors 250 as shown in FIG. 2. Finally, twelve receivers 220 surround the 3×3 array 210. Each of the receivers 220 includes nine readers 260 disposed in a 3×3 orthogonal array to provide for the corresponding quantum silos 230, 240 in the array of quantum silos 200 one-hundred and eight (108) bits storage capacity. That is, one bit is accounted for by each reader 260 resulting in nine bits for each receiver 220 and therefore, 108 bits for each set of twelve receivers surrounding a 3×3 array 210 resulting in twelve bytes of data and twelve bits for checksum, encryption and tenancy.

Figure 4:
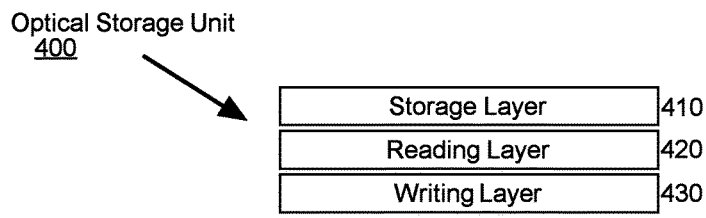
FIG. 4 is a schematic illustration of an optical storage unit adapted for inclusion in an optical storage device; and, FIG. 5 is a schematic illustration of an optical storage device.
Figure 5:
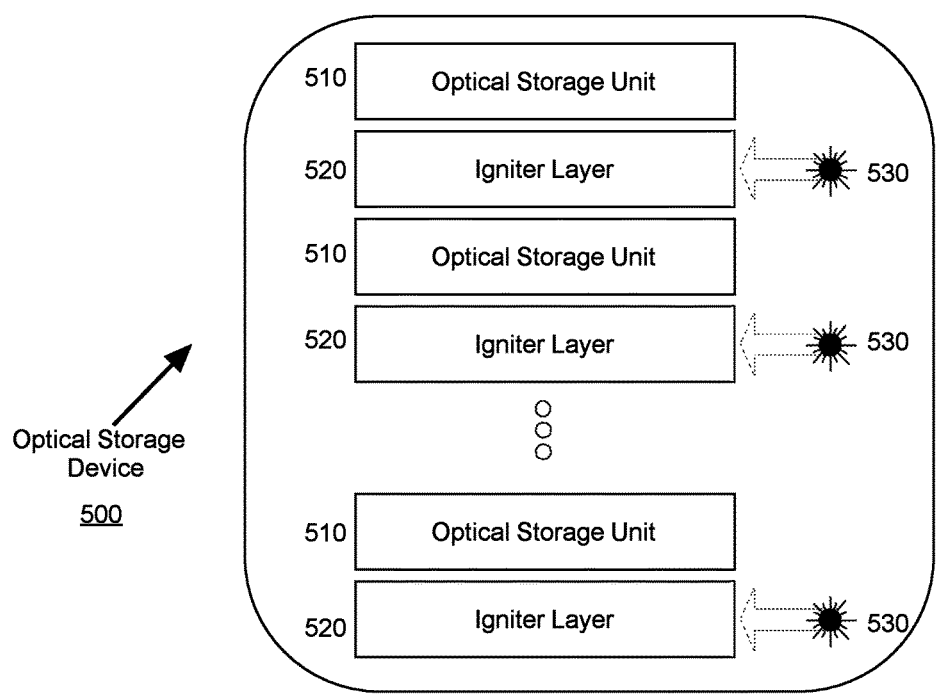

Of note, each of the arrays of the quantum silos 200 is positioned in a matrix 300 defining storage layer. As shown in FIG. 3, alternate cells 310A in the matrix 300 each mark a position of a corresponding one of the quantum silos while remaining cells 310B transport data from the quantum silos. The matrix 300 of the storage layer is then used to form an optical storage unit. In this regard, referring to FIG. 4 an optical storage unit 400 is adapted for inclusion in an optical storage device. The optical storage unit 400 includes a sandwiching of a storage layer 410 with both a reading layer 420 and also a writing layer 430 so as to form the optical storage unit 400. The optical storage unit 400 then is used as a base component of an optical storage device. More specifically, in reference to FIG. 5, an optical storage device 500 is formed by stacking different optical storage units 510 with an igniter layer 520 disposed therebetween. The igniter layer enables an ultraviolet light source 530 to illuminate the quantum dots of the quantum silos.

In operation, each storage layer of an optical storage unit 510 may be referenced as a mapped memory page in a memory addressing model. Specifically, data is written to a selected one of the quantum silos at selected ones of the corners of an array of the selected one of the quantum silos by firing the ultraviolet light source 530 against a corner of the array of the selected one of the silos towards a surrounded one of the quantum dots for bytes corresponding to a two, nearest ones of the readers. Similarly, data is written to a selected one of the quantum silos at an interior portion of the array of the selected one of the silos by firing the ultraviolet light source 530 against faces of one of the mirrors in a set adjacent to the selected one of the quantum silos at the interior portion of the array. In either circumstance, a refresh interval is set at which the ultraviolet light source 530 is fired at a corresponding one of the igniter layers 520 so as to refresh data stored in the selected one of the quantum silos. Finally, a byte of data is read from a selected one o the quantum silos by verifying ones of the receivers at a perimeter of a corresponding array of the selected one of the quantum silos for a presence or absence of light emitting from a surrounded one of the quantum dots.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims as follows:

We claim:

1. An optical storage device fabrication method comprising:
    forming different quantum silos in a substrate, each of the quantum silos comprising
        a plurality of quantum dots, each of the quantum dots comprising a storage unit of a predefined storage capacity, and,
        a multiplicity of crystals each comprising an orthogonal shape with eight faces in three bands surrounding a corresponding one of the quantum dots, each of the crystals being positioned in an array comprising one of the crystals at each corner of the array and remaining cells of the array at a perimeter of the array each comprising a set of mirrors, and at least one interior cell of the array comprising an orthogonally shaped crystal of four faces in three bands surrounding a corresponding one of the quantum dots;
    placing a set of receivers in the substrate surrounding each of the quantum silos and pointing inwardly towards a perimeter of the array;
    creating a matrix of the quantum silos to form a storage layer, wherein alternate cells in the matrix each mark a position of a corresponding one of the quantum silos and remaining ones of the cells transport data from the quantum silos; and
    sandwiching a reading layer and a writing layer beneath the storage layer and stacking the multiple sandwiched storage, reading and writing layers to form an optical storage unit with an igniter layer disposed between each sandwiched reading, writing and storage layer enabling an ultraviolet light source to illuminate the quantum dots of the quantum silos.

2. The method of claim 1, wherein each array of a corresponding one of the quantum silos is a three by three (3×3) array with five vertices forming an X shape of quantum silos.

3. The method of claim 1, wherein the set of mirrors comprises three mirrors each shaped as a one by three (1×3) orthogonal array, a middle one of the mirrors having three faces each corresponding to one of three faces of an adjacent side of an adjacent interior one of the crystals, and each outer one of the mirrors having a three faces each corresponding to one of three faces of an adjacent side of an adjacent corner one of the crystals.

4. The method of claim 1, wherein each of the receivers comprises nine readers disposed in a three by three (3×3) orthogonal array to provide for a corresponding one of the quantum silos one-hundred and eight (108) bits storage capacity.

5. The method of claim 1, wherein the storage layer is referenced as a memory page to map to in a memory addressing model.

6. The method of claim 1, further comprising:
    writing to a selected one of the quantum silos at selected ones of the corners of an array of the selected one of the silos by firing a light beam against a corner of the array of the selected one of the silos towards a surrounded one of the quantum dots for bytes corresponding to a two, nearest ones of the readers; and,
    setting a refresh interval and at each refresh interval, firing the light beam so as to refresh data stored in the selected one of the quantum silos.

7. The method of claim 1, further comprising:
    writing to a selected one of the quantum silos at an interior portion of the array of the selected one of the silos by firing a light beam against faces of one of the mirrors in a set adjacent to the selected one of the quantum silos at the interior portion of the array; and,
    setting a refresh interval and at each refresh interval, firing the light beam so as to refresh data stored in the selected one of the quantum silos.

8. The method of claim 6, further comprising reading a byte from a selected one o the quantum silos by verifying ones of the receivers at a perimeter of a corresponding array of the selected one of the quantum silos for a presence or absence of light emitting from a surrounded one of the quantum dots.

9. An optical storage device comprising:
    a multiplicity of quantum silos in a substrate, each of the quantum silos comprising
        a plurality of quantum dots, each of the quantum dots comprising a storage unit of a predefined storage capacity, and,
        a multiplicity of crystals each comprising an orthogonal shape with eight faces in three bands surrounding a corresponding one of the quantum dots, each of the crystals being positioned in an array comprising one of the crystals at each corner of the array and remaining cells of the array at a perimeter of the array each comprising a set of mirrors, and at least one interior cell of the array comprising an orthogonally shaped crystal of four faces in three bands surrounding a corresponding one of the quantum dots;

a set of receivers in the substrate surrounding each of the quantum silos and pointing inwardly towards a perimeter of the array;

a matrix of the quantum silos to form a storage layer, wherein alternate cells in the matrix each mark a position of a corresponding one of the quantum silos and remaining ones of the cells transport data from the quantum silos;

a reading layer and a writing layer beneath the storage layer and stacking the multiple sandwiched storage, reading and writing layers to form an optical storage unit with an igniter layer disposed between each sandwiched reading, writing and storage layer; and, an ultraviolet light source illuminate the quantum dots of the quantum silos through the igniter layer.

10. The device of claim 9, wherein each array of a corresponding one of the quantum silos is a three by three (3×3) array with five vertices forming an X shape of quantum silos.

11. The device of claim 9, wherein the set of mirrors comprises three mirrors each shaped as a one by three (1×3) orthogonal array, a middle one of the mirrors having three faces each corresponding to one of three faces of an adjacent side of an adjacent interior one of the crystals, and each outer one of the mirrors having a three faces each corresponding to one of three faces of an adjacent side of an adjacent corner one of the crystals.

12. The device of claim 9, wherein each of the receivers comprises nine readers disposed in a three by three (3×3) orthogonal array to provide for a corresponding one of the quantum silos one-hundred and eight (108) bits storage capacity.

13. The device of claim 9, wherein the storage layer is referenced as a memory page to map to in a memory addressing model.

14. A quantum silo comprising:

a plurality of quantum dots, each of the quantum dots comprising a storage unit of a predefined storage capacity, and, a multiplicity of crystals each comprising an orthogonal shape with eight faces in three bands surrounding a corresponding one of the quantum dots, each of the crystals being positioned in an array comprising one of the crystals at each corner of the array and remaining cells of the array at a perimeter of the array each comprising a set of mirrors, and at least one interior cell of the array comprising an orthogonally shaped crystal of four faces in three bands surrounding a corresponding one of the quantum dots.

15. The quantum silo of claim 14, wherein the array is a three by three (3×3) array with five vertices forming an X shape.

16. The quantum silo of claim 14, wherein the set of mirrors comprises three mirrors each shaped as a one by three (1×3) orthogonal array, a middle one of the mirrors having three faces each corresponding to one of three faces of an adjacent side of an adjacent interior one of the crystals, and each outer one of the mirrors having a three faces each corresponding to one of three faces of an adjacent side of an adjacent corner one of the crystals.

* * * * *